(12) United States Patent
Imoto

(10) Patent No.: US 7,589,386 B2
(45) Date of Patent: Sep. 15, 2009

(54) SEMICONDUCTOR DEVICE AND MANUFACTURING METHOD THEREOF

(75) Inventor: Tsutomu Imoto, Tokyo (JP)

(73) Assignee: Sony Corporation, Tokyo (JP)

( * ) Notice: Subject to any disclaimer, the term of this patent is extended or adjusted under 35 U.S.C. 154(b) by 321 days.

(21) Appl. No.: 11/558,272

(22) Filed: Nov. 9, 2006

(65) Prior Publication Data

US 2007/0085147 A1  Apr. 19, 2007

Related U.S. Application Data

(63) Continuation of application No. 10/956,774, filed on Oct. 1, 2004, which is a continuation-in-part of application No. 10/239,534, filed as application No. PCT/JP02/00249 on Jan. 16, 2002, now abandoned.

(51) Int. Cl.
*H01L 23/62* (2006.01)

(52) U.S. Cl. .................. 257/371; 257/369; 257/357; 257/365; 438/199; 438/223

(58) Field of Classification Search .................. 257/357, 257/365, 368, 369, 371; 438/199, 223
See application file for complete search history.

(56) References Cited

U.S. PATENT DOCUMENTS

| 4,117,587 | A |   | 10/1978 | Kano |
| 4,452,646 | A |   | 6/1984 | Zuleeg |
| 5,275,959 | A | * | 1/1994 | Kobayashi et al. ........ 438/278 |
| 5,296,394 | A |   | 3/1994 | Shim |
| 5,786,615 | A |   | 7/1998 | Saito |
| 5,977,594 | A | * | 11/1999 | Takao ........................ 257/357 |

(Continued)

FOREIGN PATENT DOCUMENTS

EP  0614229  9/1994

(Continued)

OTHER PUBLICATIONS

S.M. Sze, "Physics of Semiconductor Devices", John Wiley & Sons, New York; pp. 32 and 314.

(Continued)

*Primary Examiner*—Thao X Le
*Assistant Examiner*—Thanh Y Tran
(74) *Attorney, Agent, or Firm*—Sonnenschein Nath & Rosenthal LLP

(57) ABSTRACT

A semiconductor device including a first field effect transistor having a source, a first conductivity type drain, a gate, and a first conductivity type channel layer formed beneath the gate and between the source and the drain. The device also includes a first conductivity type well region, a second conductivity type channel layer formed on the surface of the well region, a first wire that connects an end of the second conductivity type channel layer to the first conductivity type drain, a second wire that connects the other end of the second conductivity type channel layer to a power source, and a third wire 208 that connects the first conductivity type well region to the gate of the first field effect transistor. This semiconductor device and manufacturing method thereof enables low power consumption and simple control of threshold voltage values as well as decreases the number of conventional manufacturing processes.

5 Claims, 11 Drawing Sheets

U.S. PATENT DOCUMENTS

| | | |
|---|---|---|
| 6,163,052 A | 12/2000 | Liu |
| 6,281,705 B1 | 8/2001 | Yu |
| 6,307,223 B1 | 10/2001 | Yu |
| 2001/0035557 A1 * | 11/2001 | Park et al. .................. 257/371 |

FOREIGN PATENT DOCUMENTS

| | | |
|---|---|---|
| JP | 60-247956 | 12/1985 |
| JP | 60247956 | 12/1985 |
| JP | 61-150380 | 7/1986 |
| JP | 61150380 | 7/1986 |
| JP | 61-267358 | 11/1986 |
| JP | 61150380 | 11/1986 |
| JP | 61267358 | 11/1986 |
| JP | 61-292413 | 12/1986 |
| JP | 62-199049 | 9/1987 |
| JP | 04-130823 | 5/1992 |
| JP | 6314699 | 11/1994 |
| JP | 2000-277621 | 10/2000 |
| JP | 2000-306923 | 11/2000 |

OTHER PUBLICATIONS

S. Gibilisco, The Illustrated Dictionary of Electronics, Sixth Edition, McGraw-Hill TAB Books, pp. 204 and 604.

Japanese Office Action, issued on Nov. 18, 2008.

S.M. Sze, "Physics of Semiconductor Devices", John Wiley 7 Sons, New York 1981; pp. 32 and 314.

S. Gibilisco, The Illustrated Dictionary of Electronics, Sixth Edition, McGraw-Hill TAB Books 1994, pp. 204 nd 604.

* cited by examiner

SEMICONDUCTOR DEVICE AND MANUFACTURING METHOD THEREOF

CROSS REFERENCE TO RELATED APPLICATION

This application is a continuation of U.S. patent application Ser. No. 10/956,774, filed Oct. 1, 2004, which is incorporated herein by reference to the extent permitted by law and which is a continuation-in-part application of U.S. patent application Ser. No. 10/239,534, filed Feb. 19, 2003, which is a 371 of PCT International Application No. PCT/JP02/00249, filed Jan. 16, 2002, which claims priority to Japanese application no. P2001-014987, filed Jan. 23, 2001. The entirety of which is incorporated herein by reference to the extent permitted by law.

TECHNICAL FIELD

The present invention relates to a semiconductor device and manufacturing method thereof, in particular, a semiconductor device having complementary logic gates and manufacturing method thereof.

BACKGROUND OF THE INVENTION

CMOS (Complementary Metal-Oxide Semiconductor) type logic gates are widely used for silicon integrated circuits, though DCFL (Direct Coupled Field-Effect Transistor Logic), which is much simpler in structure compared to CMOS, is widely used for compound semiconductor integrated circuits.

In compound semiconductor integrated circuits, in particular, in MMIC (Monolithic Microwave Integrated Circuit), RF (Radio Frequency) switch circuits into which logic circuits such as decoder circuits are built, have been put into practical use and DCFL circuits are also being used in these as well.

Since these MMIC circuits are utilized in portable wireless terminals such as cellular telephones, their power consumption is a factor that influences the battery life of the terminals. In order to extend the battery life and enhance the convenience of the terminal users, lower power consumption of terminals has been demanded. Consequently, lower power consumption of the above-mentioned logic circuits has become a major concern.

The basic composition of a DCFL type logic circuit used in the above-mentioned manner will be described referring to the figures. FIG. 6A is a schematic of a DCFL type inverter. FIG. 6B is a cross sectional view of the DCFL type inverter formed on a GaAs semi-insulating substrate.

In FIG. 6B, the cross section of the upper-layer wire is omitted and only lines that represent wire are shown for sake of simplicity.

As shown in FIGS. 6A and 6B, a DCFL type logic gate is comprised of two elements; a pull-down transistor 301 and a pull-up resistor 401. The pull-down transistor 301 shown in FIG. 6B is an n channel type JFET (Junction Field Effect Transistor) and has an n type channel layer 303 formed on the surface of a GaAs substrate 302. This n type channel layer 303 is, for example, a layer implanted with Si ions.

A p type gate layer 304 is formed on this n type channel layer 303. This p type gate layer 304 is, for example, a layer diffused with Zn.

In addition, an n type source contact region 305 and n type drain contact region 306, between which the p type gate layer 304 is held, are formed on the surface layer of the n type channel layer 303. Both of the n type source contact region 305 and n type drain contact region 306 are, for example, layers implanted with Si ions.

An insulating film 307 comprised of, for example, silicon nitride film, is formed on the GaAs substrate 302. Contact holes are opened in the insulating film 307 on both of the n type source contact region 305 and n type drain contact region 306 and then through these contact holes a source ohmic electrode 308 and drain ohmic electrode 309 are formed on the n type source contact region 305 and the n type drain contact region 306, respectively. The source ohmic electrode 308 and the drain ohmic electrode 309 are, for example, formed by alloying AuGe/Ni into an ohmic junction.

A gate wire 310 is formed to connect to the p type gate layer 304 and a source wire 311 is formed to connect to the source ohmic electrode 308. A drain wire 312 is also formed to connect the drain ohmic electrode 309. The gate wire 310, source wire 311 and drain wire 312 are all metallic thin film formed from, for example, three layers of Ti/Pt/Au.

In contrast, the pull-up resistor 401 has an n type conductivity layer 402 that is formed on the surface layer of the GaAs substrate 302. The n type conductivity layer 402 is, for example, a layer implanted with Si ions. N type contact regions 403 and 404 are formed on the surface layer of the n type conductivity layer 402. Both of the n type contact regions 403 and 404 are, for example, layers implanted with a high concentration of Si ions.

Contact holes are opened in the insulating film 307 on both the n type contact regions 403 and 404, and ohmic electrodes 405 and 406 are formed through these contact holes on the n type contact regions 403 and 404, respectively. These ohmic electrodes 405 and 406 are, for example, formed by alloying AuGe/Ni into an ohmic junction.

Furthermore, an interlayer insulation film 313 is formed on the insulating film 307. A metal wire 407 (the drain wire 312) and a metal wire 408 are formed on this interlayer insulation film 313. The metal wires 407 and 408 are respectively connected to the ohmic electrodes 405 and 406, through the contact holes formed on the interlayer insulation film 313. These metal wires 407 and 408 are, for example, a metallic thin film formed from three layers of Ti/Pt/Au.

The manufacturing procedure of the logic gate shown in FIG. 6 will be described referring to FIGS. 7 and 8.

At first, as shown in FIG. 7A, the n type conductivity layer 402 implanted with n type impurity ions through a predetermined ion implantation mask is formed on a formation region 401A of the pull-up resistor 401 of the GaAs substrate 302 after forming, for example, a silicon nitride film or silicon oxide film on the GaAs substrate 302 as a through film 314 for ion implantation.

Next, as shown in FIG. 7B, the n type channel layer 303 implanted with n type impurity ions through a predetermined ion implantation mask is formed on a formation region 301A of the pull-down transistor 301 of the GaAs substrate 302. Ion implantation that forms the n type conductivity layer 402 may also be performed after performing ion implantation that forms the n type channel layer 303.

As shown in FIG. 7C, n type impurities ions are implanted onto the n type channel layer 303 and the n type conductivity layer 402 of the GaAs substrate 302 through a predetermined ion implantation mask to respectively form the n type source contact region 305 and the n type drain contact region 306 as well as the n type contact regions 403 and 404.

As shown in FIG. 7D, the through film 314 is removed and the implanted impurity ions activated by annealing.

As shown in FIG. 8E, the insulating film 307 of, for example, a silicon nitride film is formed on the GaAs substrate 302.

As shown in FIG. 8F, contact holes are opened in the insulating film 307 and then p type impurities are diffused through these contact holes to form the p type gate layer 304.

As shown in FIG. 8G, the gate wire 310 is formed on the p type gate layer 304.

As shown in FIG. 8H, contact holes are opened in the insulating film 307 on the n type source contact region 305, the n type drain contact region 306 and the n type contact regions 403 and 404. The source ohmic electrode 308, the drain ohmic electrode 309 and the ohmic electrodes 405 and 406 are formed through these contact holes.

Thereafter, as shown in FIG. 6b, the interlayer insulation film 313 is formed. Contact holes are opened in the interlayer insulation film 313 and the source wire 311, drain wire 312 and the metal wires 407 and 408 are formed.

The above-mentioned DCFL type logic gate uses a small number of gates when compared to the composition of other gates such as SCFL (Source Coupled FET Logic). Consequently, the surface area of the substrate occupied by the gates is small, which is favorable for the high integration of an integrated circuit. Further, when the pull-down transistor 301 is off, the static current consumption is held low. Because of this, there is the advantage of low power consumption.

Compared to CMOS however, the power consumption is high. This is due to the fact that when the pull-down transistor 301 is on, static current is consumed through the pull-up resistor 401 in the logic gate shown in FIG. 6.

In contrast to this, when the pull-up resistor 401 is replaced with a p channel type FET 501 as shown in FIGS. 9A and B, the static current consumption when the pull-down transistor 301 is on can be reduced. Consequently, according to the composition shown in FIGS. 9A and B, although the power consumption is still high compared to CMOS, it can be brought close to the power consumption of CMOS.

FIG. 9A is a schematic of a complementary logic gate that has a p channel type transistor as the pull-up transistor 501. FIG. 9B is a cross section thereof. As shown in FIG. 9B, the composition of the pull-down transistor 301 is the same as that in FIG. 6B so a description is omitted.

The pull-up transistor 501 has an n type well region 502 formed by ion implanting, for example, Si onto the surface layer of the GaAs substrate 302. In addition, a p type channel layer 503 is formed by diffusing, for example, Zn onto the surface layer of the n type well region 502. Even further, an n type gate layer 504 is formed by ion implanting, for example, Si onto the surface layer of the p type channel layer 503.

A p type source contact region 505 and p type drain contact region 506, between which the n type gate layer 504 is held, are formed on the surface layer of the p type channel layer 503. Both the p type source contact region 505 and the p type drain contact region 506 are layers formed by diffusing, for example, Zn.

Contact holes are opened in the insulating film 307 on both of the p type source contact region 505 and the p type drain contact region 506 and then through these contact holes a source ohmic electrode 507 and drain ohmic electrode 508 are formed. Both the source ohmic electrode 507 and drain ohmic electrode 508 are, for example, formed by alloying AuGe/Ni into an ohmic junction.

Further, a gate wire 509 is formed to connect to the n type gate layer 504, a source wire 510 is formed to connect to the source ohmic electrode 507 and a drain wire 511 is formed to connect to the drain ohmic electrode 508. The gate wire 509, the source wire 510, and the drain wire 511 are all comprised of metallic thin film formed from, for example, three layers of Ti/Pt/Au.

An n type well contact region 512, that contains a high concentration of n type impurities, is formed on the portion of the surface layer of the n type well region 502 other than the p type channel layer 503. An ohmic electrode 513 is formed on the n type well contact region 512. When a silicon substrate is used in place of the GaAs substrate 302 however, an ohmic junction is formed by metal wire on the silicon substrate. Because of this, including a high concentration of n type impurities in the n type well contact region is normally not required.

The procedure to manufacture the logic gate shown in FIG. 9 will be described referring to FIGS. 10 and 11.

In this case, to start, the through film 314 for ion implantation is formed using, for example, a silicon nitride film or silicon oxide film, on the GaAs substrate 302, as shown in FIG. 10A Then, the n type well region 502 is formed on a formation region 501A of the GaAs substrate 302 of this pull-up transistor 501 by ion implanting n type impurities through a predetermined ion implantation mask.

Next, as shown in FIG. 10B, the n type channel layer 303 is formed on the formation region 301A of the pull-down transistor 301 of the GaAs substrate 302 by ion implanting n type impurities through a predetermined ion implantation mask.

It is possible to form the above-mentioned n type well region 502 after forming the n type channel layer 303.

Next, as shown in FIG. 10C, the p type channel layer 503 forms on the n type well region 502 by ion implanting p type impurities through a predetermined ion implantation mask.

It is possible to form the above-mentioned n type channel layer 303 after forming the p type channel layer 503.

Next, as shown in FIG. 10D, the n type source contact region 305 and the n type drain contact region 306 are formed on the n type channel layer 303 by ion implanting n type impurities through a predetermined ion implantation mask and the n type well contact region 512 is formed on the n type well region 502 by ion implanting n type impurities through a predetermined ion implantation mask.

As shown in FIG. 10E, the through film 314 is removed and the implanted impurity ions are activated by annealing.

As shown in FIG. 11F, the insulating film 307 of, for example, a silicon nitride film is formed on the GaAs substrate 302.

As shown in FIG. 11G, openings are respectively formed on the n type channel layer 303 between the n type source contact region 305 and the n type drain contact region 306 as well as on the insulating film 307 of the p type channel layer 503. Through these openings p type impurities are diffused to form the p type gate layer 304, the p type source contact region 505 and the p type drain contact region 506.

As shown in FIG. 11H, the gate wire 310 is formed on the p type gate layer 304. Further, the source ohmic electrode 507 and the drain ohmic electrode 508 are formed on the p type source contact region 505 and the p type drain contact region 506, respectively.

As shown in FIG. 11I, an opening is formed on the insulating film 307 between the p type source contact region 505 and the p type drain contact region 506 of the formation region 501A of the p type channel layer 503 of the pull-up transistor 501 and then n type impurities are diffused through this opening to form the n type gate layer 504.

As shown in FIG. 11J, the gate wire 509 is formed on the n type gate layer 504 and the ohmic electrode 513 is formed on the n type well contact region 512. Further, the source ohmic electrode 308 is formed on the n type source contact region 305 and the drain ohmic electrode 309 is formed on the n type drain contact region 306.

Thereafter, as shown in FIG. 9B, the interlayer insulation film 313 is formed. Contact holes are formed on the interlayer insulation film 313 to form the source wires 311, 510 and the drain wires 312, 511, and so on.

According to the composition that has a pull-up transistor as described above, the power consumption can be reduced compared to the composition that has the pull-up resistor shown in FIG. 6 although the process to form a well and a gate layer must be added to the manufacturing process. Therefore, the manufacturing cost of the semiconductor devices increases.

In the composition shown in FIG. 9, the p type channel layer 503 is formed by ion implantation of impurities into the n type well region 502 formed by ion implantation of impurities, and the n type gate layer 504 is also formed by ion implantation of impurities into the p type channel layer 503. Consequently, the impurity concentration of the n type gate layer 504 fluctuates due to the influence resulted from the condition of the plurality of ion implantation processes. Because of this, control of the threshold voltage value of the pull-up transistor 501 becomes comparatively difficult, which is a factor in reductions to the yield. Increase in the manufacturing cost due to this type of yield reduction is also a problem.

SUMMARY OF THE INVENTION

In view of the above-described problems, the present invention has the object of providing a semiconductor device having complementary logic gates, which has lower power consumption and threshold voltage values of which is easily controlled with high precision.

Furthermore, the present invention has the object of providing a semiconductor device manufacturing method in which the above-mentioned semiconductor devices are provided with fewer manufacturing processes.

The semiconductor device according to the present invention is a semiconductor device in which a first field effect transistor having a first conductivity type channel is formed on the surface layer of a semiconductor substrate and a second field effect transistor having a second conductivity type channel is also formed on the surface layer of the semiconductor substrate. The first field effect transistor has a first conductivity type channel layer, a first conductivity type source region formed on one end of the first conductivity type channel layer, and a first conductivity type drain region formed on the other end of the first conductivity type channel layer. The first field effect transistor also has a gate region between the first conductivity type source region and the first conductivity type drain region.

The second field effect transistor has a first conductivity type well region comprised of a gate region separated from the first field effect transistor, in which a second conductivity type channel layer is formed on the first conductivity type well region.

One end of the second conductivity type channel layer is connected to the first conductivity type drain region by a first wire and the other end of the second conductivity type channel layer is connected to a first power source by a second wire. The first conductivity type well region comprised of the gate region is connected by a third wire to a gate region of the first field effect transistor.

In another implementation the semiconductor device according to the present invention is a semiconductor device in which a first field effect transistor having a first conductivity type channel is formed on the surface layer of a semiconductor substrate and a second junction type field effect transistor, having a second conductivity type channel is formed on the surface layer of the semiconductor substrate. The first field effect transistor has a first conductivity type channel layer, a first conductivity type source region formed on one end of the first conductivity type channel layer, and a first conductivity type drain region formed on the other end of the first conductivity type channel layer. The first field effect transistor also has a gate region between the first conductivity type source region and the first conductivity type drain region.

The second junction type field effect transistor has a second conductivity type channel layer separated from the first field effect transistor, a second conductivity type source region formed on one end of the conductivity type channel layer, and a second conductivity type drain region formed on the other end of the second conductivity type channel layer. In this implementation, the second junction type field effect transistor is formed without a gate region between the second conductivity type source region and the second conductivity type drain region.

In this composition as well, one end of the second conductivity type channel layer is connected to a first conductivity type drain region by a first wire and the other end of the second conductivity type channel layer is connected to a first power source by a second wire.

In addition, a third wire connects the first conductivity type well region to the gate region of the first field effect transistor. In each of the semiconductor devices according to the above-mentioned compositions, the first field effect transistor may have a first conductivity type gate layer.

Further, the second field effect transistor may have a composition in which a well contact region that has an impurity concentration higher than the first conductivity type well region is formed separately from the second conductivity type channel layer on the first conductivity type well region comprised of the gate region.

This well contact region is connected by the third wire to the gate region of the first field effect transistor.

The semiconductor substrate in each of the above-mentioned semiconductor devices according to the present invention can be a compound semiconductor substrate of, for example, GaAs.

Furthermore, a manufacturing method of the semiconductor device according to the present invention is the manufacturing method of the semiconductor device in which the first field effect transistor having the first conductivity type channel and the second field effect transistor having the second conductivity type channel are formed on the surface layer of the semiconductor substrate. This manufacturing method has the object of manufacturing the above-described semiconductor devices using the processes of: forming the first field effect transistor, which has the first conductivity type channel, the first conductivity type source region and the first conductivity type drain region, onto the surface layer of the semiconductor substrate; forming the first conductivity type well region comprised of the gate region of the second field effect transistor separated from the first field effect transistor onto the surface layer of the semiconductor substrate; forming the second conductivity type channel layer onto the surface layer of the first conductivity type well region; forming a first wire which connects one end of the second conductivity type channel layer to the first conductivity type drain region; forming a second wire which connects the other end of the second conductivity type channel layer to the first power source; and forming a third wire which connects the first conductivity type well region to the gate region of the first field effect transistor.

Further, in the manufacturing method of the semiconductor device according to the present invention, the above-mentioned process that forms the first field effect transistor has the processes of: forming the first conductivity type channel layer onto the surface layer of the semiconductor substrate; forming the first conductivity type source region and the first conductivity type drain region onto the surface layer of the first conductivity type channel layer; and forming the second conductivity type gate layer onto the surface layer of the first conductivity type channel layer between the first conductivity type source region and the first conductivity type drain region.

In addition, the manufacturing method of the semiconductor device according to the present invention enables manufacturing the semiconductor devices through a process that forms the well contact region containing first conductivity impurities with a concentration higher than the first conductivity type well region onto the surface layer of the first conductivity type well region separated from the second conductivity type channel layer before forming the third wire after forming the second conductivity type channel layer.

The semiconductor device according to the present invention has almost no static current consumption flow during a low level output and achieves a low power consumption complementary logic gate.

According to the semiconductor device of the present invention, since the second field effect transistor causes the first conductivity type well region to function as a gate and to control the current flow in the second conductivity type channel layer, the number of ion implantation processes which determine the impurity concentration of the gate can be reduced compared to a case where a gate semiconductor layer is formed onto the surface layer of a channel layer as in, for example, the conventional structure shown in FIG. 9B.

Consequently, controlling threshold voltage values becomes easier.

According to the manufacturing method of the present invention, since it is possible to form a complementary logic gate while avoiding a process in which a gate layer is formed by implanting ions onto the surface layer of the second conductivity type channel as in a conventional manufacturing method, the number of manufacturing processes can be reduced.

Since the number of ion implantation processes which influence the threshold voltage value is reduced, it becomes easier to control threshold voltage values with higher accuracy.

Further, according to the above-described advantage, the occurrence of inferior products due to the threshold voltage value decreases, thereby improving the yield of the semiconductor devices.

Even further, reducing the number of manufacturing processes and improving the yield make it possible to reduce manufacturing costs.

DETAILED DESCRIPTION OF THE PRESENTLY PREFERRED EMBODIMENTS

An embodiment of the semiconductor device according to the present invention and manufacturing method thereof will be described referring to the attached drawings.

Figure 1A:
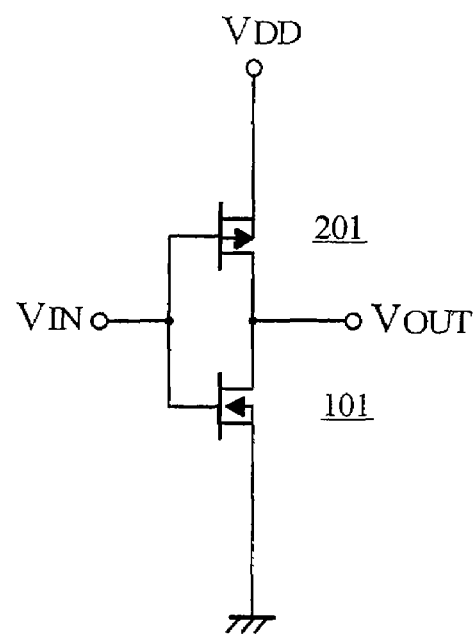
FIG. 1A is a schematic of the semiconductor device of the present invention.
Figure 1B:
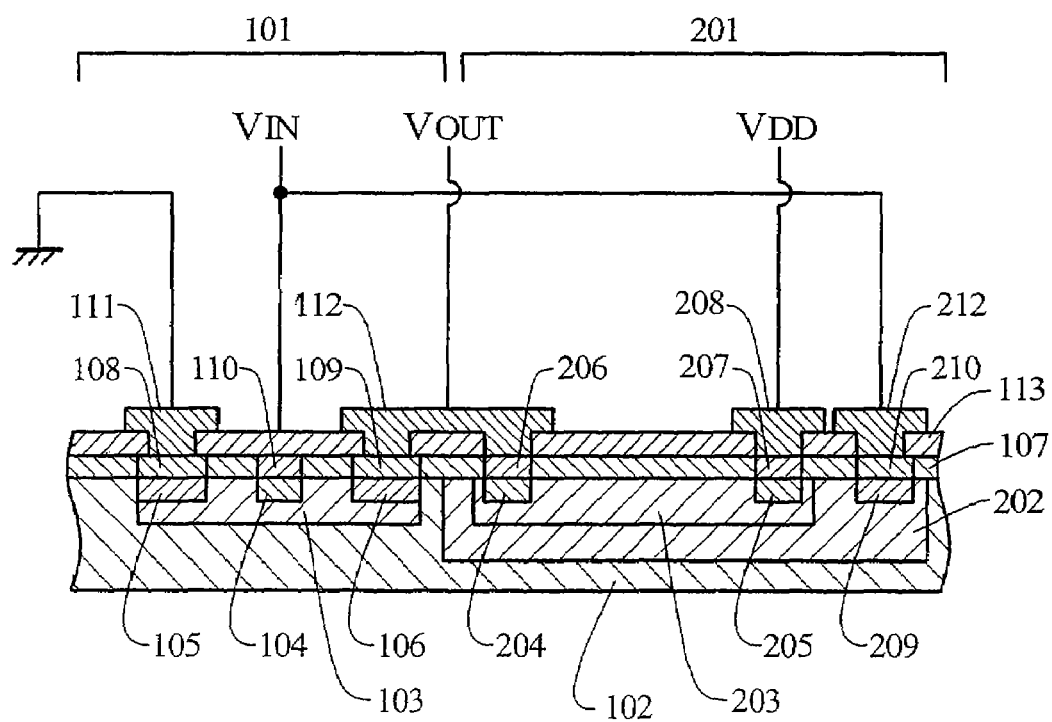
FIG. 1B is a cross sectional view corresponding to FIG. 1A.

FIG. 1A is a schematic showing a DCFL inverter according to an embodiment of the present invention and FIG. 1B is a cross sectional view of the DCFL inverter according to the embodiment.

In FIG. 1B, for sake of simplicity, the cross section for the upper layer wire is omitted and only the lines representing the wires are shown.

As shown in FIGS. 1A and B, the DCFL type logic gate is comprised of two elements; a pull-down transistor 101 formed of a first field effect transistor having a first conductivity type channel, such as an n type channel and a pull-up transistor 201 formed of the second field effect transistor having a second conductivity type channel, such as a p type channel.

The pull-down transistor 101 shown in FIG. 1B is a junction type field effect transistor JFET of an n channel type. Further, the pull-up transistor 201 is effectively a junction type field effect transistor JFET of a p channel type, which causes the first conductivity type, in this example, an n type well region 202 to function as a gate and to control the p channel.

The pull-down transistor 101 has an n type channel layer 103 of the first conductivity type formed on the surface layer of a semiconductor substrate 102 comprised of, for example, a GaAs substrate. This n type channel layer 103 is, for example, a layer implanted with Si ions. A p type gate layer 104 of the second conductivity type is formed on the surface layer of the n type channel layer 103. The p type gate layer 104 is, for example, a layer diffused with Zn.

An n type drain contact region 106 of the first conductivity type and similarly an n type source contact region 105 of the first conductivity type, between which the p type gate layer 104 is held, are formed on the surface layer of the n type channel layer 103. The n type source contact region 105 and drain contact region 106 are, for example, layers implanted with a high concentration of Si ions.

An insulating film 107 of, for example, silicon nitride film, is formed on the GaAs substrate 102. Contact holes are opened in the insulating film 107 on both of the n type source contact region 105 and the drain contact region 106, and then through these contact holes a source ohmic electrode 108 and drain ohmic electrode 109 are formed on the n type source contact region 105 and the drain contact region 106, respectively. The source ohmic electrode 108 and the drain ohmic electrode 109 are, for example, formed by alloying AuGe/Ni into an ohmic junction.

A gate wire 110 is formed to connect to the p type gate layer 104, and a source wire 111 is formed to connect to the source ohmic electrode 108. A drain wire 112 is also formed to connect to the drain ohmic electrode 109. The gate wire 110, source wire 111 and drain wire 112 are, for example, metallic thin films formed from three layers of Ti/Pt/Au.

In contrast, the pull-up transistor 201 has the n type well region 202 implanted with, for example, Si ions onto the surface layer of the GaAs semiconductor substrate 102. A p type channel layer 203 of the second conductivity type is formed onto the surface layer of the n type well region 202 of the first conductivity type. This p type channel layer 203 is a layer implanted with, for example, Mg, C or Zn ions. Ohmic contact regions 204 and 205 are formed on the surface layer of the p type channel layer 203. These regions 204 and 205 are implanted with a high concentration of, for example, Mg, C or Zn of the p type, namely, second conductivity type.

Contact holes are opened in the insulating film 107 on the p type ohmic contact regions 204 and 205, and ohmic electrodes 206 and 207 are formed through these contact holes. The ohmic electrodes 206 and 207 are comprised of a metallic thin film formed of, for example, three layers of Ti/Pt/Au.

An interlayer insulation film 113 is formed on the insulating film 107. The ohmic electrode 206 on the output $V_{OUT}$ side is connected to the first wire, formed of the drain wire 112 of the pull-down transistor 101. A second wire is formed of a power source wire 208 ($V_{DD}$ electrode) to connect to the ohmic electrode 207 on the power source $V_{DD}$ side. The electrode wire 208 is comprised of a metallic thin film formed of, for example, three layers of Ti/Pt/Au similarly to the source wire 111 and drain wire 112 of the pull-down transistor 101.

Further, an n type well contact region 209 containing a high concentration of n type impurities of the first conductivity type, is formed on the surface layer of the n type well region 202 of the portion other than the p type channel layer 203. An ohmic electrode 210 is formed on this well contact region 209. The ohmic electrode 210 is formed by, for example, alloying AuGe/Ni to form an ohmic junction. A third wire 212 is formed on the surface of the ohmic electrode 210 and connected to the gate wire 110 (e.g., the gate region) of the pull-down transistor 101 (e.g., the first field effect transistor).

Next, the operation of the semiconductor device according to the embodiment of the present invention will be described referring to FIGS. 2 and 3.

Figure 2:
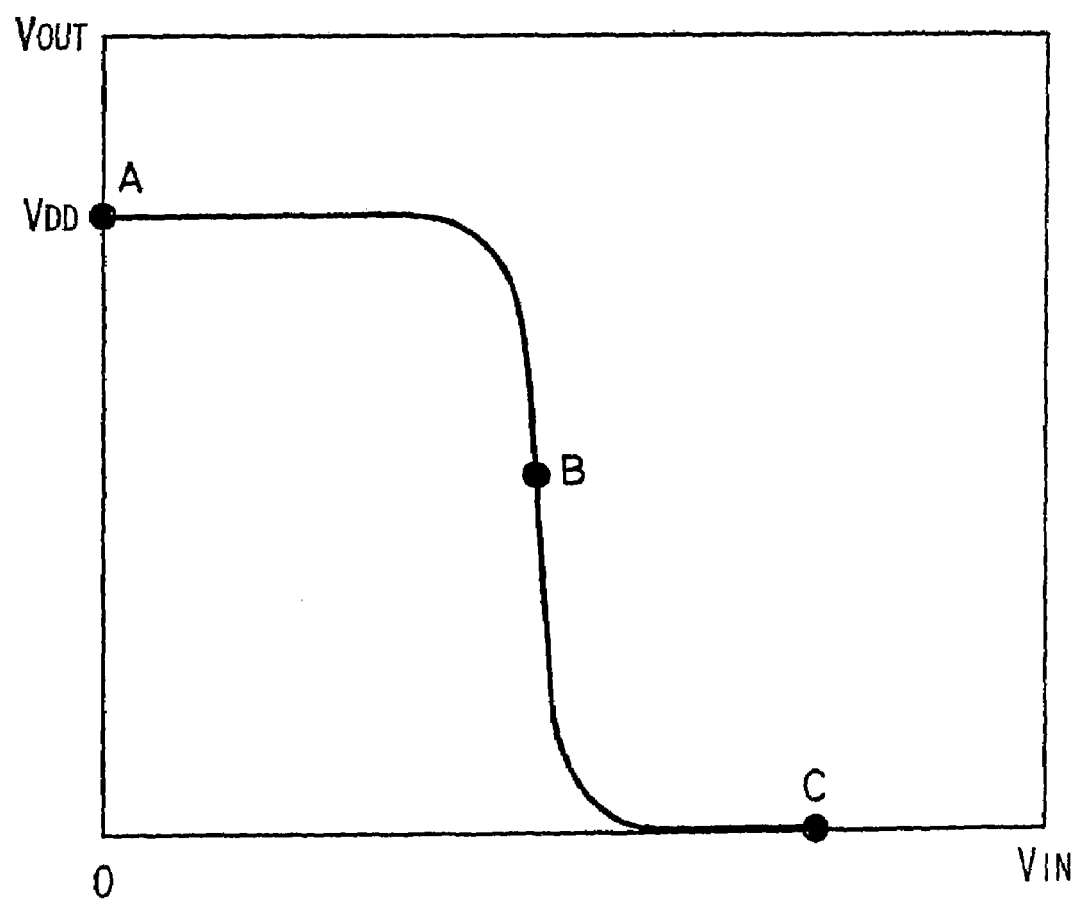
FIG. 2 is a diagram showing the transfer characteristics of the complementary logic gates of the semiconductor device according to the present invention.

FIG. 2 is a curved line showing the transfer characteristics between the pull-down transistor 101 and the pull-up transistor 201.

Figure 3A:
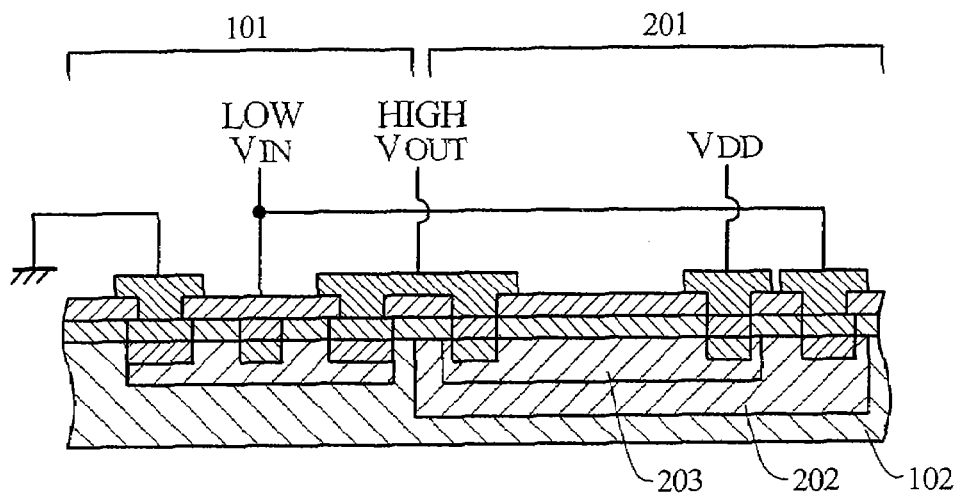
FIGS. 3A to 3C are cross sectional views showing the operation of the complementary logic gates of the semiconductor device according to the present invention.
Figure 3B:
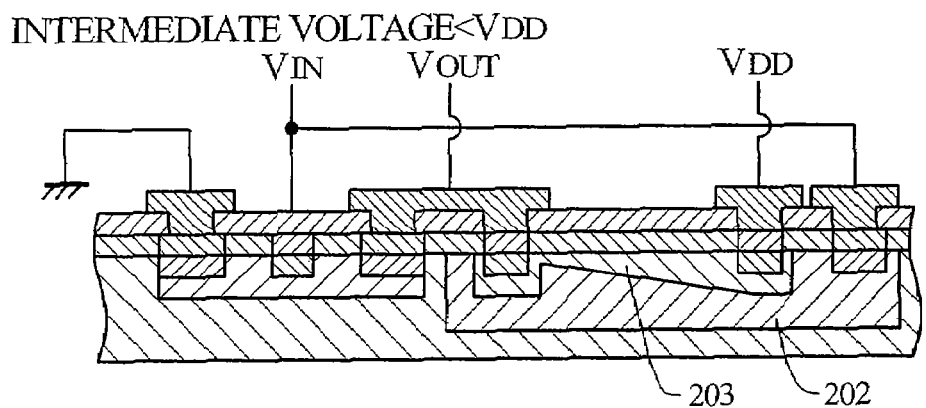
Figure 3C:
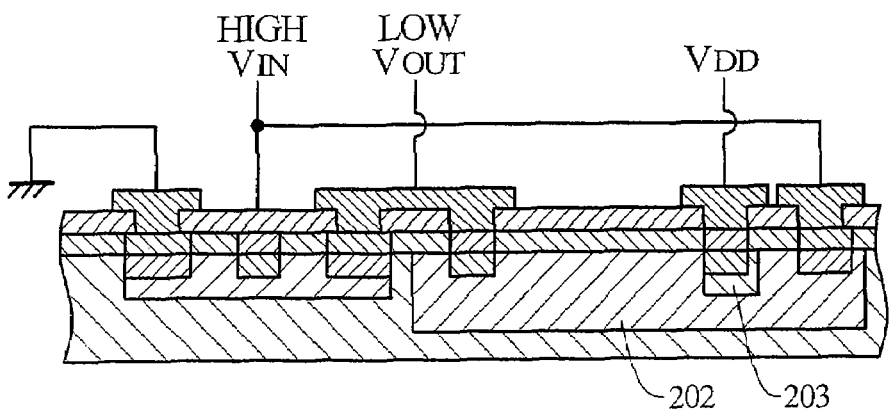

FIGS. 3A to 3C are cross sectional views showing typical expansion of the depletion layer at points A to C of FIG. 2.

The input $V_{IN}$ at point A in FIG. 2 is a low level. Consequently, the pull-down transistor 101 (n channel type JFET) is off and a high level voltage is output to the output $V_{OUT}$. At this time, $V_{OUT}$ of the pull-up transistor 201 (p channel type JFET) is approximately the power source voltage $V_{DD}$. Therefore, as shown in FIG. 3A, the pn junction between the n type well region 202 and the p type channel layer 203 is at an approximate zero bias from the $V_{DD}$ side to the $V_{OUT}$ side (the pull-down transistor 101 side). This brings the conductance of the p type channel layer 203 up to its maximum value.

$V_{IN}$ at point B in FIG. 2 moves to the center position between a high and low level. At this time, $V_{OUT}$ changes to a voltage lower than $V_{DD}$ in response to the conductance ratio between the n channel type JFET 101 and the p channel type JFET 201. As shown in FIG. 3B, because of this, a reverse bias of the amount "$V_{DD}$-$V_{OUT}$" is applied to the $V_{OUT}$ side of the p type channel layer 203 with respect to the n type well region 202, thereby reducing the conductance.

$V_{IN}$ at point C in FIG. 2 changes to a high level and the n channel type JFET 101 turns on. This brings $V_{OUT}$ close to a low level. At this time, as shown in FIG. 3C, the end of the $V_{OUT}$ side of the p type channel layer 203 is reverse biased by the voltage $V_{DD}$ with respect to the n type well region 202. Consequently, the p channel is lost from the n type well region 202 due to the depletion layer to greatly reduce the conductance. As a result, there is almost no flow of static power consumption during a low level output, thereby achieving a low power consumption complementary logic gate. This type of the low power consumption complementary logic gate is ideally applied to portable wireless terminals such as an MMIC.

Next, an embodiment of the manufacturing method of the above-mentioned embodiment of the semiconductor device according to the present invention will be described referring to the process diagrams of FIGS. 4 and 5.

Figure 4A:
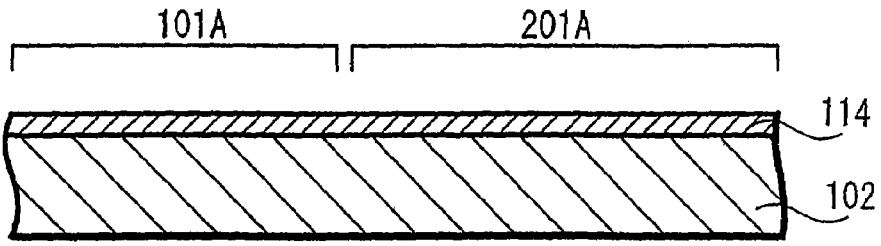
FIGS. 4A to 4E are cross sectional views showing the manufacturing processes of the manufacturing method of the semiconductor device according to the present invention.

At first, as shown in FIG. 4A, a silicon nitride film or silicon oxide film, for example, is formed on the GaAs semiconductor substrate 102 as a through film 114 for ion implantation. The through film 114 comprised of a silicon nitride film can be formed by a plasma CVD whose ingredient gas is, for example, SiH4 and N2.

The through film 114 is provided for the purpose of preventing damage to the substrate due to ion implantation. Consequently, the film thickness of the through film 114 is determined by taking into consideration the required energy of the ion implantation in order to obtain the desired FET characteristics. When forming a silicon nitride film as the through film 114, the film thickness can be, for example, 50 nm.

Figure 4B:
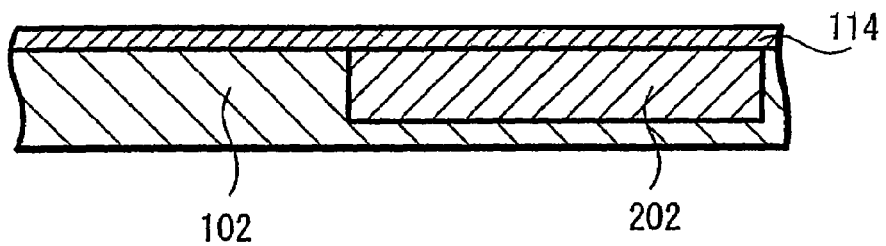

Next, as shown in FIG. 4B, in order to form the n type well region 202, n type impurities, for example Si ions, are implanted through a predetermined ion implantation mask in the formation region 201A of the pull-up transistor 201 of the GaAs semiconductor substrate 102.

Figure 4C:
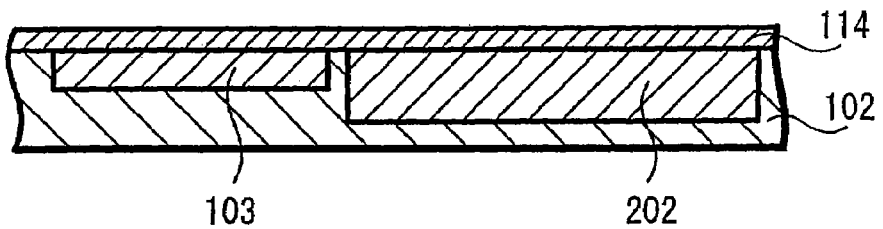

Next, as shown in FIG. 4C, in order to form the n type channel layer 103, n type impurity ions are implanted through a predetermined ion implantation mask in the formation region 101A of the pull-down transistor 101 of the GaAs semiconductor substrate 102.

After the ion implantation to form the n type channel layer 103, the ion implantation to form the n type well region 202 can also be performed. Si, for example, is used as the n type impurity. The impurity profile of the n type channel layer 103 is determined in response to the desired characteristics of the n channel type JFET 101.

Figure 4D:
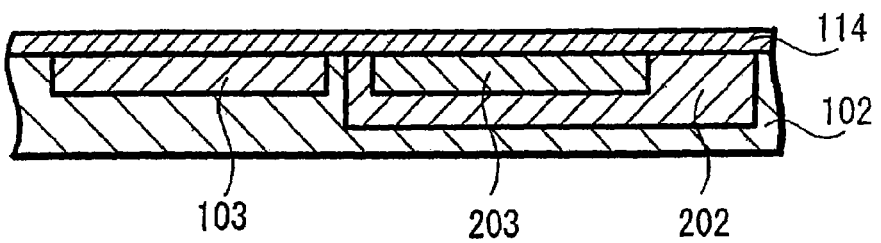

Next, as shown in FIG. 4D, p type impurity ions are implanted through a predetermined ion implantation mask in the formation region 201A of the n type well region 202 of the pull-up transistor 201 in order to form the p type channel layer 203. It is possible to perform the ion implantation to form the n type channel layer 103 after the ion implantation to form the p type channel layer 203.

The impurity profile of the n type well region 202 and the p type channel layer 203 of the pull-up transistor 201 are determined such that the $V_{OUT}$ terminal side of the p type channel layer 203 is depleted to enter a pinch-off state by reverse bias between the n type well region 202 when the logic gate shown in FIG. 1 outputs a low level voltage.

The concentration of the n type well region 202 is preferably set to the concentration higher than the sum total of the concentration of the shallow acceptor level and deep acceptor level existing in the GaAs substrate 102 to reduce the influence that incurs the pinchoff voltage of the p type channel due to the depletion from the substrate side.

Figure 4E:
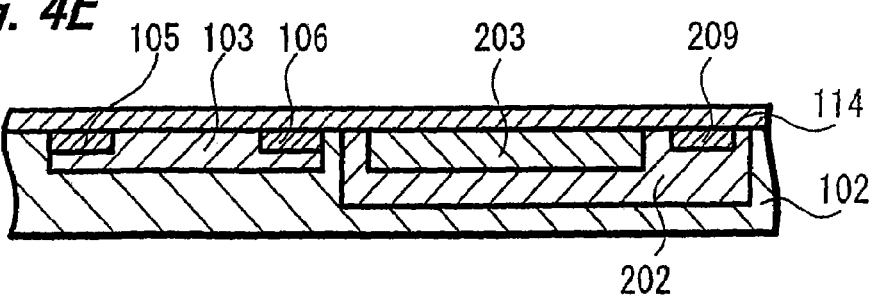

Next, as shown in FIG. 4E, n type impurity ions are implanted into the GaAs substrate 102 in order to form the n type source contact region 105, the n type drain contact region 106 and the n type well contact region 209. The impurity profile of the n type source contact region 105 and the n type drain contact region 106 are determined in response to the desired characteristics of the n channel type JFET 101. For example, Si ions are implanted as the impurity with ion energy of 150 KeV and a doping amount of $2\times10^{13}$ ions/cm$^2$. The n type well contact region 209 can be formed simultaneously with the n type source contact region 105 and the n type drain contact region 106.

Figure 5F:
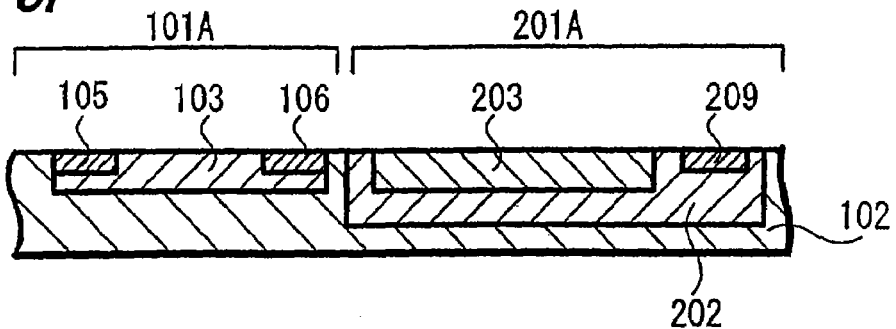
FIGS. 5F to 5J are cross sectional views showing the manufacturing processes of the manufacturing method of the semiconductor device of the present invention.

Next, as shown in FIG. 5F, the through film 114 is removed using, for example, a hydrofluoric acid (HF) type etching solution and the implanted impurity ions are activated by annealing. The annealing temperature is preferably from 800° C. to 850° C. In order to prevent arsenic (As) from vaporizing and escaping from the GaAs substrate 102 during this annealing, arsine is supplied to have a predetermined partial pressure.

Figure 5G:
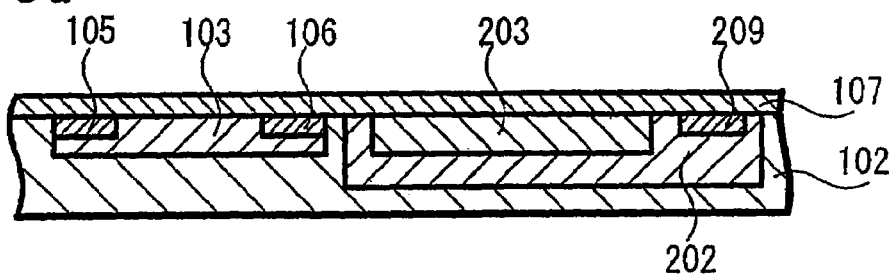

As shown in FIG. 5G, the insulating film 107, which is comprised of, for example, a silicon nitride film with a thickness of 300 nm, is formed on the GaAs substrate 102. The insulating film 107 comprised of this silicon nitride film can be formed by a plasma CVD whose ingredient gas is, for example, SiH$_4$ and N$_2$.

Figure 5H:
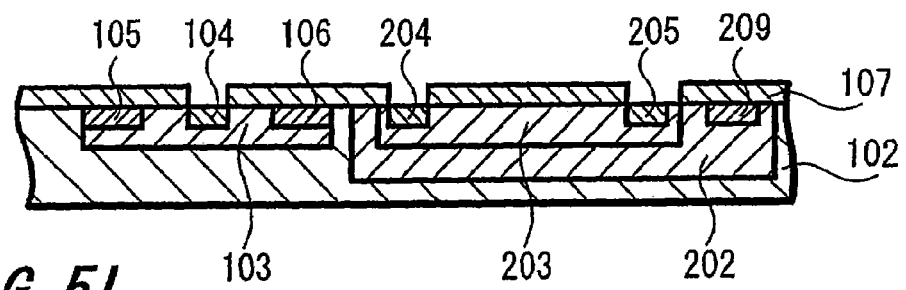

As shown in FIG. 5H, openings are formed on the insulating film 107. These openings are provided on the formation region of the p type gate layer 104 of the pull-down transistor 101 and the each formation region of the p type ohmic contact regions 204 and 205 of the pull-up transistor 201. The formation of the openings can be performed by means of anisotropic etching such as reactive ion etching (RIE) through an etching mask of a predetermined pattern. A mixture such as CF$_4$ and H$_2$ is used for the RIE etching gas.

In this manner, p type impurities of the second conductivity type are diffused through the openings provided on the insulating film 107 to form the p type gate layer 104, namely, the p type gate layer on the pull-down transistor 101 as well as to form the p type ohmic contact regions 204 and 205 on the p type channel layer 203 of the pull-up transistor 201.

Hereupon, Zn is ideally used as the p type impurity. Diethyl zinc gas is used as the Zn diffusion source and Zn is diffused onto the substrate by, for example, an open tube vapor-phase diffusion method. Arsine is added until a predetermined partial pressure in order to prevent arsenic from escaping from the substrate due to heating during Zn diffusion. The heating temperature during the Zn diffusion is preferably about 600° C.

Figure 5I:
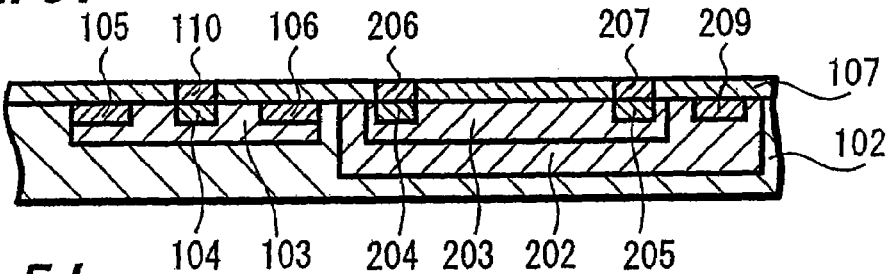

Next, as shown in FIG. 5I, the gate wire 110 and the ohmic wires 206 and 207 are formed. The gate wire 110 forms an ohmic junction with respect to the p type gate layer 104. The ohmic wires 206 and 207 form ohmic junctions with respect to the p type ohmic contact regions 204 and 205, respectively.

In order to form the gate wire 110 and the ohmic wires 206 and 207, at first, a metallic thin film comprised of electrode material, is allowed to accumulate on the entire surface of the insulating film 107 including the inside of the openings. The electrode material is for example, a three-layer film of Ti/Pt/Au and the film thickness is, for example, 30 nm for the Ti layer, 50 nm for the Pt layer and 200 nm for the Au layer. These metallic thin films can be formed using, for example, electron beam deposition or sputtering.

Next, a photoresist layer is formed on this metallic thin film. Then, an etching mask is formed by exposing and developing a predetermined pattern, in other words using photolithographic technology and the metallic thin film is etched through the openings of this etching mask. The etching can be performed by, for example, RIE or ion milling. Thereafter, the resist is removed.

Figure 5J:
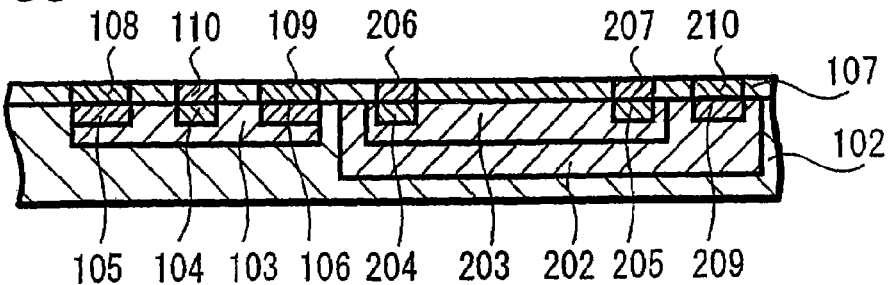
Figure 6A:
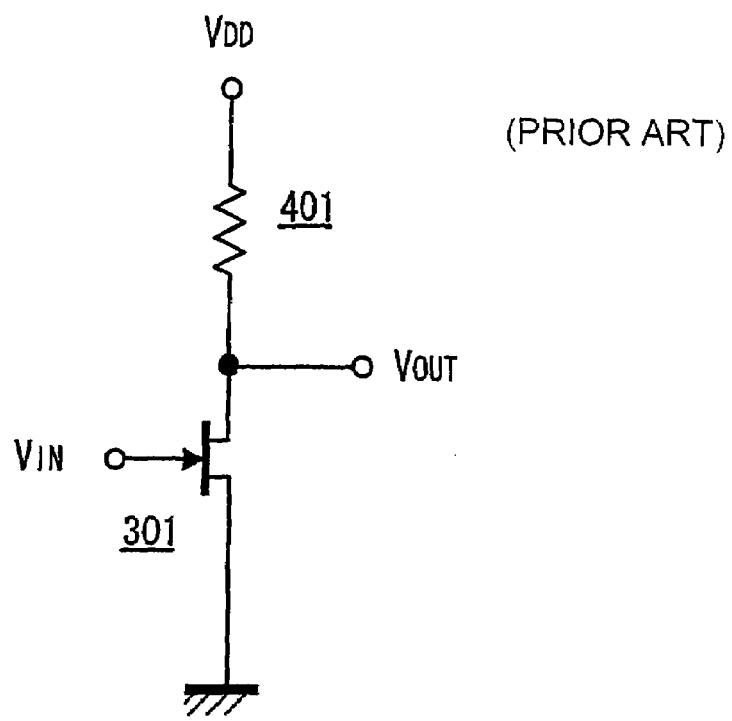
FIG. 6A is a schematic of a conventional semiconductor device.
Figure 6B:
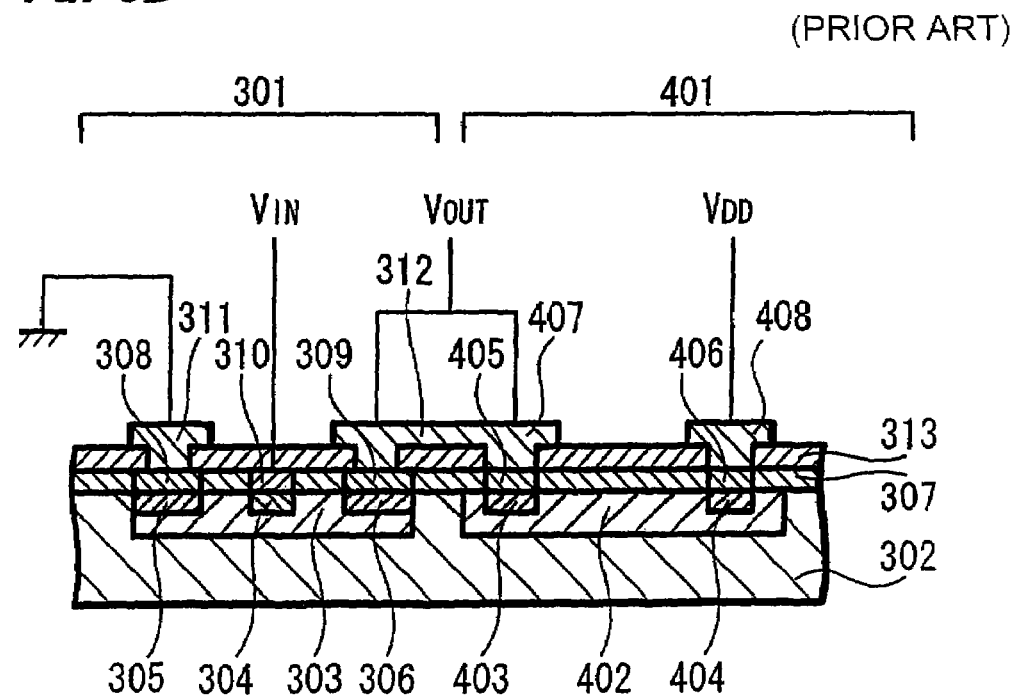
FIG. 6B is a cross sectional view corresponding to FIG. 6A.
Figure 7A:
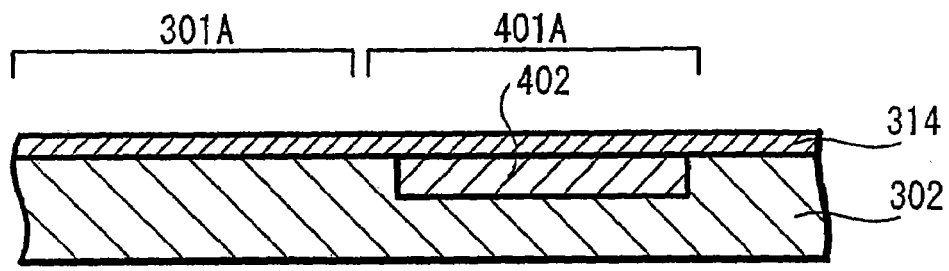
FIGS. 7A to 7D are cross sectional views showing the manufacturing processes of the manufacturing method of a conventional semiconductor device.
Figure 7B:
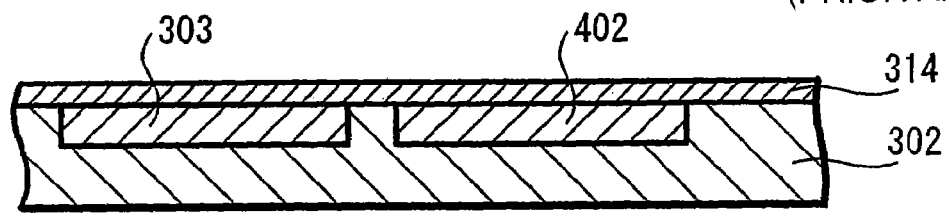
Figure 7C:
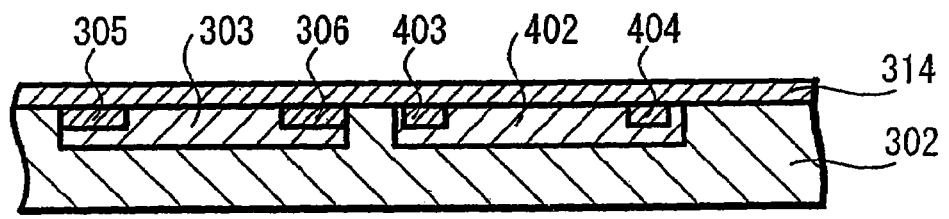
Figure 7D:
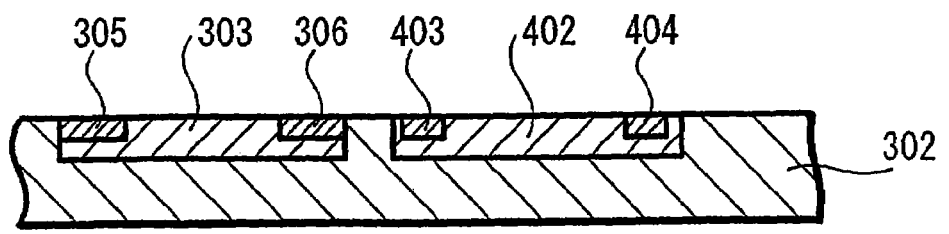
Figure 8E:
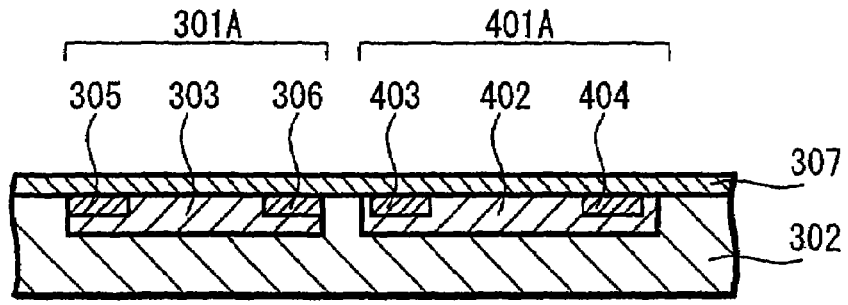
FIGS. 8E to 8H are cross sectional views showing the manufacturing processes of the manufacturing method of a conventional semiconductor device.
Figure 8F:
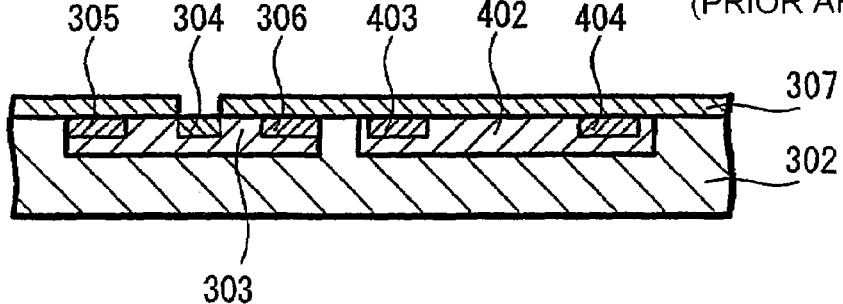
Figure 8G:
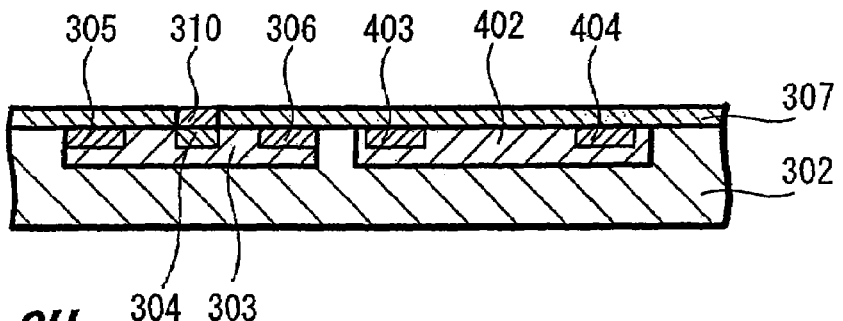
Figure 8H:
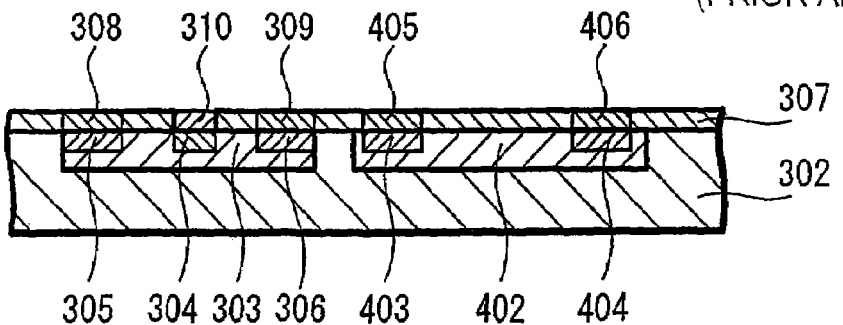
Figure 9A:
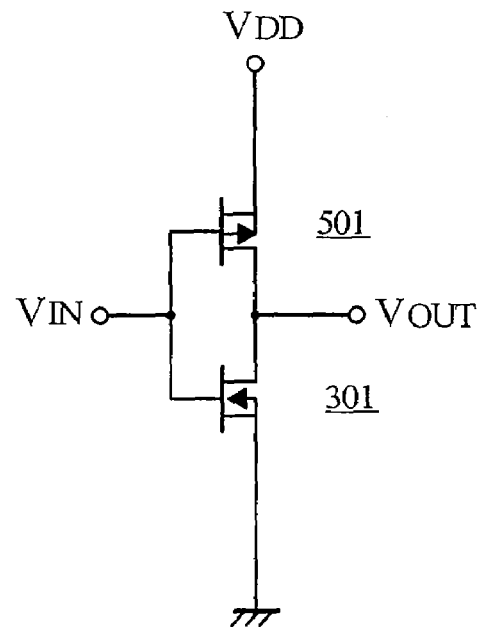
FIG. 9A is a schematic of a conventional semiconductor device.
Figure 9B:
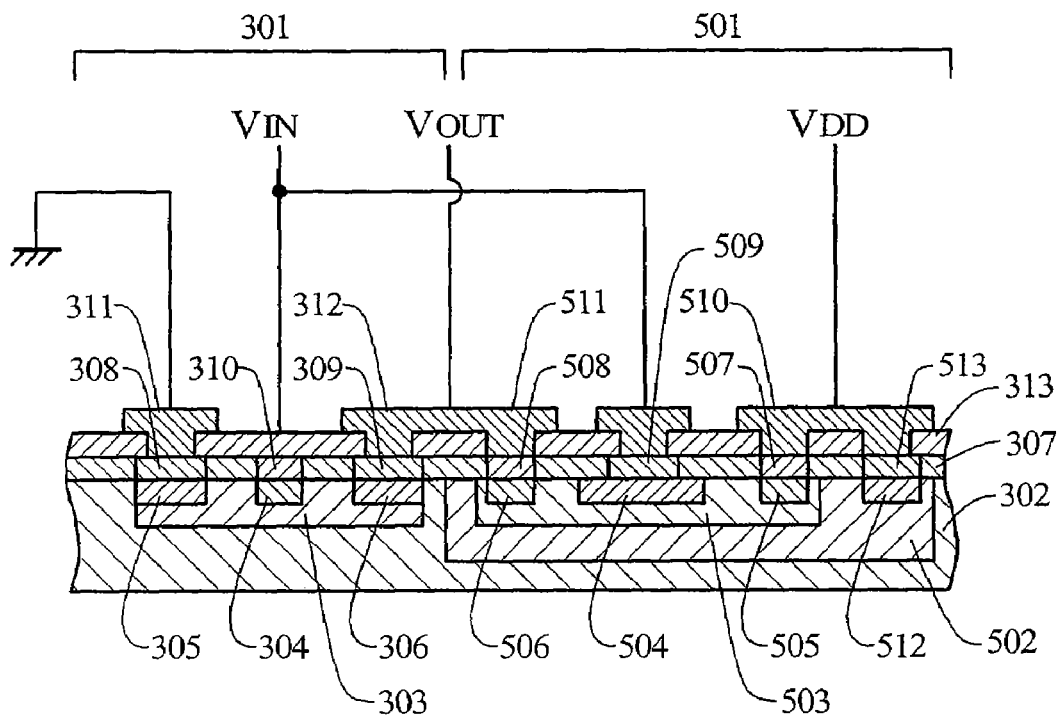
FIG. 9B is a cross sectional view corresponding to FIG. 9A.
Figure 10A:
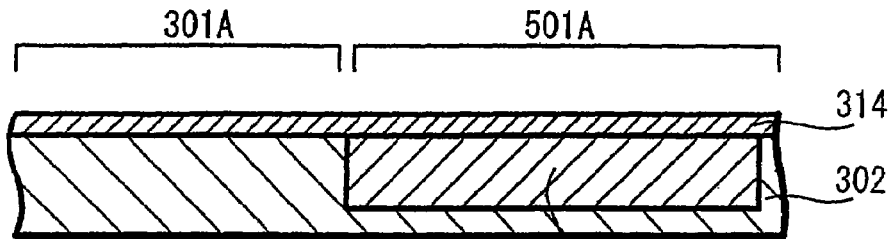
FIGS. 10A to 10E are cross sectional views showing the manufacturing processes of the manufacturing method of a conventional semiconductor device.
Figure 10B:
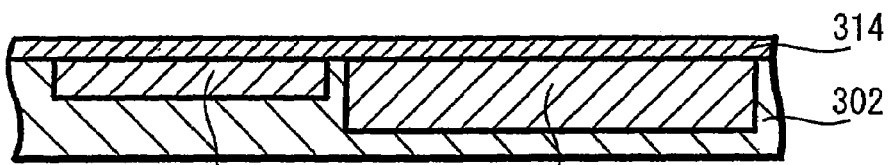
Figure 10C:
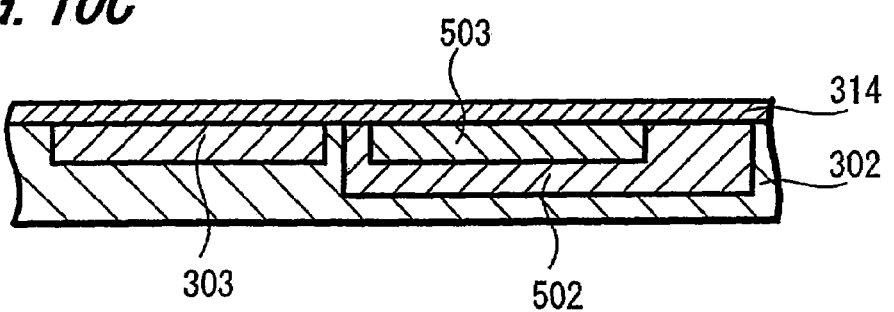
Figure 10D:
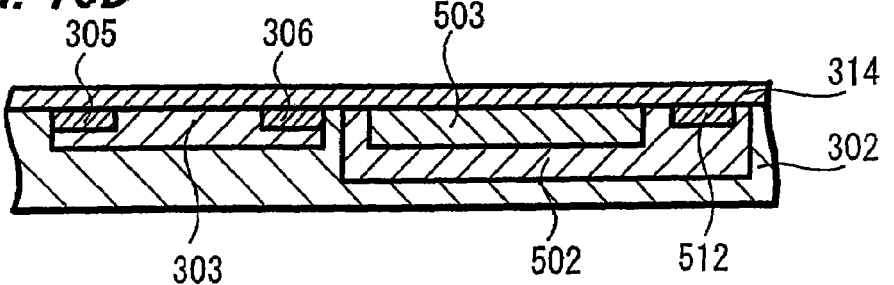
Figure 10E:
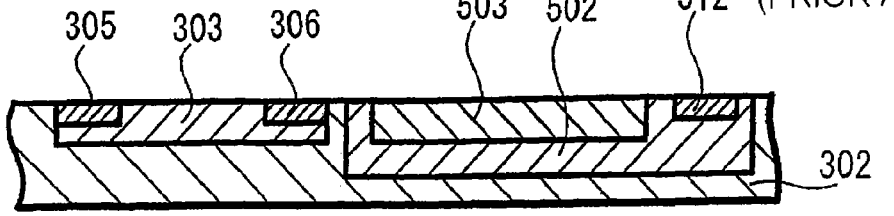
Figure 11F:
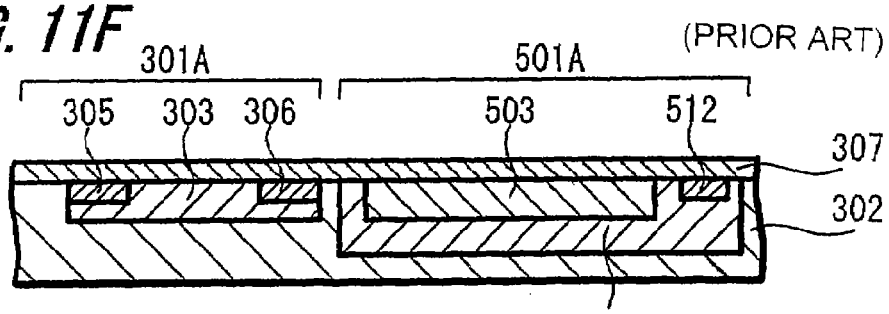
FIGS. 11F to 11J are cross sectional views showing the manufacturing processes of the manufacturing method of a conventional semiconductor device.
Figure 11G:
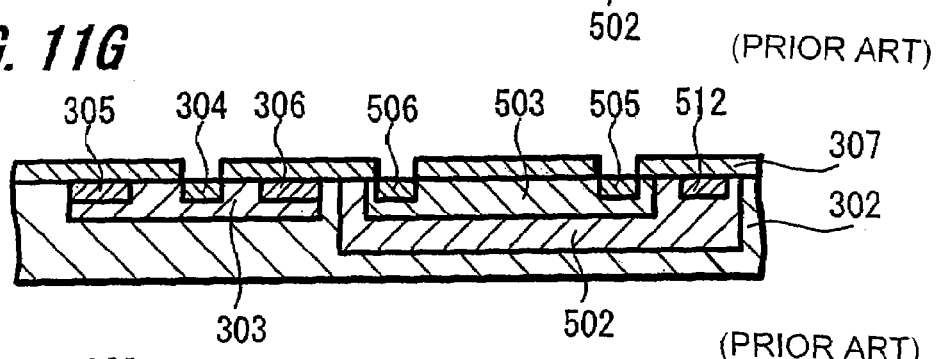
Figure 11H:
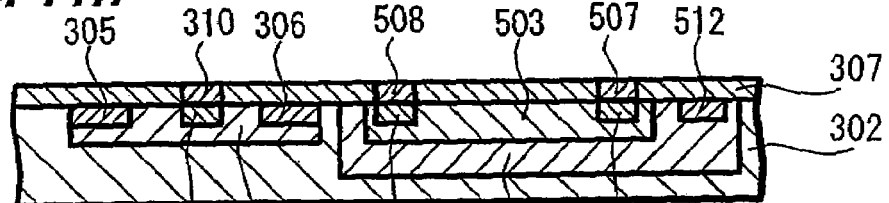
Figure 11I:
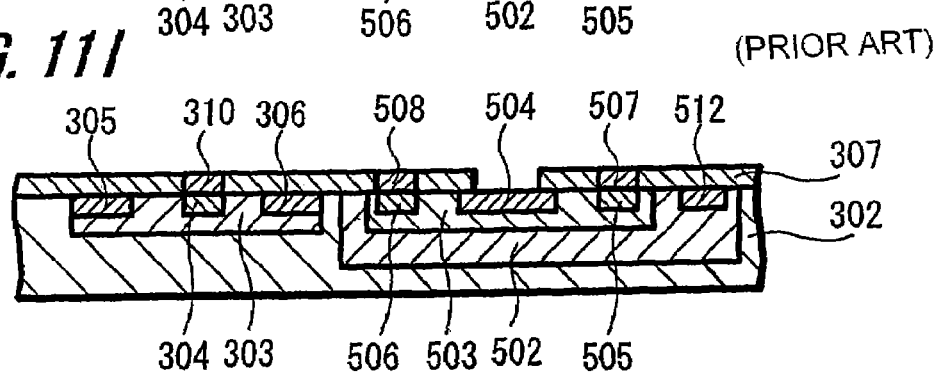
Figure 11J:
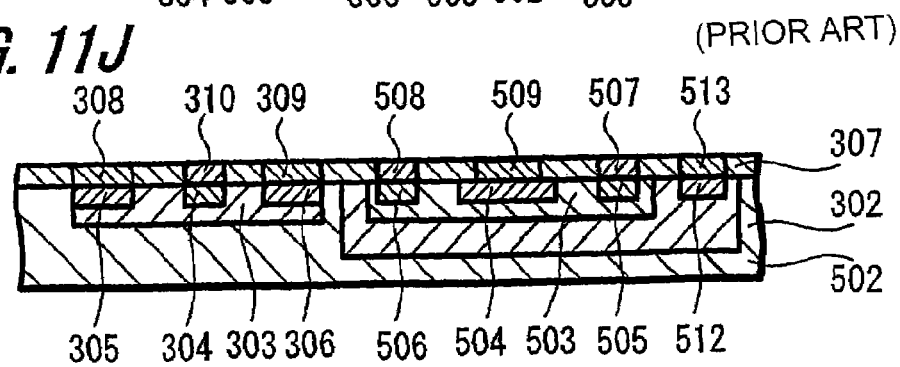

Next, as shown in FIG. 5J, the source ohmic electrode 108 and drain ohmic electrode 109 of the pull-down transistor 101 as well as the ohmic electrode 210 of the pull-up transistor 201 are formed. In order to form these three ohmic electrodes 108, 109 and 210, at first, contact holes are opened on portions, in which these ohmic electrodes are formed, of the insulating film 107. The formation of these contact holes can be performed by means of anisotropic etching such as RIE through the openings of the etching mask which is formed by the photoresist. A mixture such as CF$_4$ and O$_2$ is used for the RIE etching gas.

Next, the metallic thin film, comprised of the electrode material, is allowed to accumulate onto the entire surface while the resist of the etching mask is left as is. A two-layer film of, for example AuGe alloy and nickel is used for the electrode material. The film thickness is, for example, 170 nm for the AuGe layer and 40 nm for the Ni layer. These metallic thin films can be formed using, for example, ohmic-resistance heating vapor deposition.

Thereafter, the semiconductor substrate is soaked in an acetone or resist exfoliation solution to remove by lifting-off any unnecessary metallic thin film formed on the resist. Heat treatment is also performed in foaming gas. Consequently, an alloyed ohmic junction is formed between the metallic thin film comprised of the two layers of AuGe alloy and Ni and the contact region of the substrate. The heat treatment for the alloying should be approximately 60 seconds at 450° C.

Next, as shown in FIG. 1B, the source wire 111 and drain wire 112 of the pull-down transistor 101 as well as the power source wire 208 and the third wire 212 of the pull-up transistor 201 are formed. In order to form these metallic wires, at first, the interlayer insulation film 113 that covers the entire surface of the substrate is formed. A silicon nitride film or a silicon oxide film is preferably used for the interlayer insulation film 113. The interlayer insulation film 113 comprised of the silicon nitride film can be formed by a plasma CVD using a mixture of, for example, SiH$_4$ and NH$_3$ as ingredient gas. The film thickness of the interlayer insulation film 113 is, for example, 100 nm.

Further, contact holes in the interlayer insulation film 113 are formed on the p type gate layer 104 of the pull-down transistor 101, on the source ohmic electrode 108, on the drain ohmic electrode 109 and on the ohmic electrodes 206, 207, 210 of the pull-up transistor 201. The formation of these contact holes can be performed by, for example, RIE similar to the process that provides the openings on the insulating film 107 described in FIG. 5H.

Thereafter, a metallic thin film is formed on the entire surface of the interlayer insulation film 113 including the inside of the contact holes. The metallic thin film is processed in a wire pattern by, for example, RIE similar to the process described in FIG. 5l. The metallic thin film is a, for example, three-layer film of Ti/Pt/Au and the film thickness is, for example, 50 nm for the Ti layer, 50 nm for the Pt layer and 600 nm for the Au layer.

In this manner, the principal elements of the complementary logic gate according to the present invention are completed.

According to the embodiment of the manufacturing method of the semiconductor device of the present invention described above, a complementary logic gate can be formed without implanting ions onto the surface layer of a channel layer of a pull-up transistor to form a gate layer as in a conventional manufacturing method. Because of this, the number of manufacturing processes is reduced.

Furthermore, since the number of ion implantation processes which influence the threshold voltage value is reduced, it is easier to control the threshold voltage value. This decreases the occurrence of faulty parts caused by the threshold voltage value, thereby improving the yield of the semiconductor devices. Accordingly, reducing the number of manufacturing processes and improving the yield makes it possible to reduce manufacturing costs.

The embodiments of the semiconductor device and manufacturing method thereof of the present invention are not limited to the examples described above. For example, the present invention can also be applied when the first conductivity type is a p type and the second conductivity type is an n type.

Various modified embodiments of the present invention are also possible without departing from the spirit and scope thereof.

As described above, according to the semiconductor device of the present invention, a complementary logic gate with reduced power consumption is designed with simpler high-precision control on threshold voltage values.

Further, according to the manufacturing method of the semiconductor device of the present invention, a semiconductor device with low power consumption and simpler high-precision control on threshold voltage values can be formed in a fewer manufacturing processes.

The invention claimed is:

1. A semiconductor device in which a first field effect transistor having a first conductivity type channel and a second field effect transistor having a second conductivity type channel are formed on a surface layer of a semiconductor substrate, characterized in that:

said first field effect transistor has a first conductivity type channel layer, a first conductivity type source region formed on one end of said first conductivity type channel layer, a first conductivity type drain region formed on the other end of said first conductivity type channel layer, and a gate region formed between said first conductivity type source region and said first conductivity type drain region;

said second field effect transistor has a first conductivity type well region comprised of a gate region separated from said first field effect transistor and a second conductivity type channel layer in said first conductivity type well region, a second conductivity type source region formed on one end of said second conductivity type channel layer and a second conductivity type drain region formed on the other end of said second conductivity type channel layer;

a first wire connects one end of said second conductivity type channel layer to said first conductivity type drain region;

a second wire connects the other end of said second conductivity type channel layer to a first power source;

a third wire connects said first conductivity type well region to said gate region of said first field effect transistor; and wherein said first wire corresponds to a combined output of said first conductivity type channel and said second conductivity type channel, and wherein said first conductivity type well region and said second conductivity type channel layer collectively have an impurity profile that is formed such that the one end of said second conductivity type channel layer connected to the first wire is depleted to enter a pinch-off state by reverse bias between said first conductivity type well region and said second conductivity type channel layer when a voltage level sufficient to turn on the first field effect transistor is present on the third wire and applied to the gate of the second field effect transistor.

2. A semiconductor device according to claim 1, wherein said gate region of said first field effect transistor is comprised of a first conductivity type gate layer.

3. A semiconductor device according to claim 2, wherein a well contact region having an impurity concentration higher than said first conductivity type well region is formed on said first conductivity type well region comprised of said gate region of said second field effect transistor separated from said second conductivity type channel layer, and the third wire connects said well contact region to said gate region of said first field effect transistor.

4. A semiconductor device according to claim 1, wherein a well contact region having an impurity concentration higher than said first conductivity type well region is formed on said first conductivity type well region comprised of said gate region of said second field effect transistor separated from said second conductivity type channel layer, and the third wire connects said well contact region to said gate region of said first field effect transistor.

5. A semiconductor device according to claim 1, wherein said semiconductor substrate is a compound semiconductor substrate.

* * * * *